United States Patent [19]

Ogawa et al.

[11] Patent Number: 5,384,276

[45] Date of Patent: Jan. 24, 1995

[54] METHOD OF FABRICATING A MEMORY DEVICE WITH A MULTILAYER INSULATING FILM

[75] Inventors: Hisashi Ogawa, Katano; Yutaka Nabeshima; Masanori Fukumoto, both of Osaka, all of Japan

[73] Assignee: Matsushita Electric Industrial Co., Ltd., Osaka, Japan

[21] Appl. No.: 907,862

[22] Filed: Jul. 2, 1992

Related U.S. Application Data

[62] Division of Ser. No. 606,605, Oct. 31, 1990, Pat. No. 5,164,337.

[30] Foreign Application Priority Data

Nov. 1, 1989 [JP] Japan .................................. 1-286819
Nov. 1, 1989 [JP] Japan .................................. 1-286821

[51] Int. Cl.⁶ ...................... H01L 21/70; H01L 27/00
[52] U.S. Cl. ........................................ 437/52; 437/60; 437/919
[58] Field of Search ............... 437/52, 919, 60, 47–48

[56] References Cited

U.S. PATENT DOCUMENTS 5,071,783 12/1991 Taguchi et al. ...................... 437/52

FOREIGN PATENT DOCUMENTS 63-293967 11/1988 Japan .................................. 437/919

OTHER PUBLICATIONS

S. Inoue et al., "A New Stacked Capacitor Cell with Thin Box Structure Storage Node," Extended Abstracts of 21st Conference on Solid State Devices and Materials, Tokyo, 1989, pp. 141–144.

T. Ema et al., "3-Dimensional Stacked Capacitor Cell for 16M and 64 Drams:", IEDM Tech. 1988 (IEEE) pp. 592–595.

*Primary Examiner*—Olik Chaudhuri
*Assistant Examiner*—H. Jey Tsai
*Attorney, Agent, or Firm*—Ratner & Prestia

[57] ABSTRACT

A method of fabricating a semiconductor device is disclosed. The method comprises the steps of: forming a multi-layer film comprising two or more kinds of layers; performing first etching for patterning said multi-layer film under a first etching condition; and performing second etching for forming irregularities in the side faces of said patterned multi-layer film under a second etching condition.

4 Claims, 12 Drawing Sheets

| LAYER | ETCHING RATE/nm.min$^{-1}$ |
|---|---|
| PSG (as-depo) | 490 |
| BPSG (as-depo) | 80 |
| NSG (as-depo) | 100 |
| PSG (anealed*) | 170 |
| BPSG (anealed*) | 55 |
| NSG (anealed*) | 40 |
| SiO$_2$ | 30 |

*: N$_2$, 900°C, 30min

METHOD OF FABRICATING A MEMORY DEVICE WITH A MULTILAYER INSULATING FILM This application is a division of application Ser. No. 07/606,605, filed Oct. 31, 1990, now U.S. Pat. No. 5,164,337.

BACKGROUND OF THE INVENTION

1. Field of the Invention

The present invention relates to a method of fabricating a semiconductor device, and more particularly to a method of forming a storage capacitor in a stacked memory cell.

2. Description of the Prior Art

In recent years, the development of semiconductor devices in which numerous elements are integrated at a high density on a semiconductor chip has been actively under way. For the memory cell of the dynamic random access memory (DRAM), there have been proposed various structures suitable for miniaturization of the device.

Presently, the preferred memory cell from the standpoint of minimum area is the one transistor and one capacitor cell. In such a memory cell, signal charge is stored in the storage node of the capacitor (storage capacitor) connected to the transistor (switching transistor).

The storage node of the memory cell is required to have a surface area larger than a prescribed value. Therefore, further progress in the miniaturization of the memory cell makes it imperative for a storage node having a relatively large surface area to be formed within a small, restricted region on a semiconductor substrate.

The stacked memory cell in which the storage node is formed above a silicon substrate is suitable for higher integration of elements and has the advantage of being less likely to cause soft errors. Furthermore, the stacked memory cell has an advantage compared to the trench type memory cell having a trench capacitor in that the former is relatively easy to fabricate and suitable for mass production.

For the stacked memory cells, there have been proposed, for example, a memory cell having a box-like structure (S. Inoue, A. Nitayama, K. Hieda and F. Horiguchi: "A New Stacked Capacitor Cell with Thin Box Structured Storage Node", Ext.A bs.21th SSDM, p.141(1989)) and a memory cell having a fin structure (T. Ema, S. Kawanago, T. Nishii, S. Yoshida, H. Nishibe, T. Yabu, Y. Komeda, T. Nakano and M. Taguchi: "3-DIMENSIONAL SPARKED CAPACITOR CELL FOR 16M AND 64M DRAMS", IEDM Tech. Dig., p.592(1988)). Both of these memory cells have a structure in which the surface area of the storage node is larger than the area on the substrate occupied by the memory cell.

Referring to FIGS. 10A to 10G, we will now describe a prior art method of fabricating a semiconductor device having the above-mentioned box structured memory cell. FIG. 10A shows in cross section a fragmentary portion of a p-type silicon substrate 1 on which switching transistors 50 and an insulating film 40 covering the switching transistors 50 are formed.

The switching transistor 50 is an n-type MOSFET having n-type impurity diffusion layers 19 in the silicon substrate 1 and a word line 2. The word line 2 functions as the gate electrode of the switching transistor 50. The insulating film 40 has a multi-layer structure in which a first silicon oxide layer 3, a silicon nitride layer 4, and a second silicon oxide layer 5 are laminated one on top of the other in this order starting from the side of the substrate 1. All of these layers are deposited by a CVD technique.

As shown in FIG. 10B, a contact hole 18 is formed in the insulating film 40 by photolithography and etching, after which a first silicon layer 6, which serves as a conductive film, is formed on top of the second silicon oxide layer 5.

A third silicon oxide layer 31, a second silicon layer 10, and a fourth silicon oxide layer 32 are deposited in this order on top of the first silicon layer 6 starting from the side of the substrate 1, to form a multi-layer film 80.

An etching mask (not shown) having a prescribed pattern is formed by photolithography on the fourth silicon oxide layer 32. Thereafter, as shown in FIG. 10C, anisotropic dry etching is repeated to pattern the multi-layer film 80 in the form corresponding to the pattern of the etching mask. Since the silicon oxide layers 31 and 32 and the silicon layers 6 and 10 are formed from different materials, it is difficult to etch the multi-layer film 80 in a single etching process under the same etching condition. Therefore, each layer constituting the multi-layer film 80 is etched under different etching conditions.

Next, a third silicon layer 33 is deposited by a CVD technique over the first silicon layer 6 in such a manner as to completely cover the multi-layer film 80.

Thereafter, the third silicon layer 33 is etched back by anisotropic etching. The etching back is continued till the surfaces of the fourth silicon oxide layer 32 and the second silicon oxide layer 5 are exposed. As a result of this etching back, the second silicon layer 10 is left only on the sides of the multi-layer film 80, thus forming the structure shown in FIG. 10D.

Next, as shown in FIG. 10E, a contact hole 18 is formed in the fourth silicon oxide layer 32 and the second silicon layer 10, reaching down to the third silicon oxide layer 31. Then, the second, third, and fourth silicon oxide layers 5, 31, and 32 are removed by etching, to form a storage node 11 as shown in FIG. 10F. A dielectric film 12 and a cell plate 13 are successively formed in such a manner as to cover the storage node 11, to form a storage capacitor as shown in FIG. 10G.

Referring to FIGS. 11A to 11G, we will now describe a prior art method of fabricating a memory cell having the previously mentioned fin structure. FIG. 11A shows in cross section a fragmentary portion of a p-type substrate 1 on which switching transistors 50 are formed. The switching transistor 50 is an n-type MOSFET having n-type impurity diffusion layers 19 and a word line 2 that also serves as the gate electrode of the switching transistor 50.

A $Si_3N_4$ layer 15 is deposited by a CVD technique on the substrate 1 in such a manner as to cover the switching transistor 50, after which a first silicon oxide layer 60, a first silicon layer 61, and a second silicon oxide layer 62 are deposited in this order on top of the $Si_3N_4$ layer 15 starting from the side of the substrate 1.

A contact hole 18 is formed in a multi-layer film comprising the above-mentioned layers, as shown in FIG. 11C. Thereafter, a second silicon oxide layer 63 is deposited on top of the second silicon oxide layer 62 in such a manner as to contact the n-type impurity diffusion layer 19 of the switching transistor 50 through the contact hole 18, as shown in FIG. 11D.

Next, after patterning the second silicon layer 63, the second silicon oxide layer 62 is etched away. Also, after patterning the first silicon layer 61 (FIG. 11E), the first silicon oxide layer 60 is etched away (FIG. 11F), thus forming a storage node 11 having a fin structure. Then, a dielectric film 12 and a cell plate 13 are formed in this order on top of the storage node 11, to from a storage capacitor as shown in FIG. 11G.

SUMMARY OF THE INVENTION

The method of fabricating a semiconductor device according to the invention, which overcomes the above-discussed and numerous other disadvantages and deficiencies of the prior art, comprises the steps of: forming a multi-layer film comprising two or more kinds of layers; performing first etching for patterning said multi-layer film under a first etching condition; and performing second etching for forming irregularities in the side faces of said patterned multi-layer film under a second etching condition.

In a preferred embodiment, the etching rate difference between any layer of said multi-layer film and the neighboring layers under said second etching condition is greater than the etching rate difference between said layer and said neighboring layers under said first etching condition.

According to the invention, a method of fabricating a semiconductor device is provided, comprising the steps of: forming a multi-layer film comprising two or more kinds of layers; performing first etching for patterning said multi-layer film under a first etching condition; performing second etching for forming irregularities in the sides of a multi-layer film under a second etching condition; forming a conductive film in such a manner as to cover said multi-layer film, said conductive film having an etching rate smaller than that of any of layers constituting said multi-layer film under a third etching condition; forming openings in said conductive film at prescribed positions to expose said multi-layer film through said opening; and performing third etching under said third etching condition to remove said multi-layer film, while leaving said conductive film. Wherein the etching rate difference between any layer of said multi-layer film and the neighboring layers under said second etching condition is greater than the etching rate difference between said layer and said neighboring layers under said first etching condition.

In a preferred embodiment, said conductive film is a polycrystalline silicon film.

According to the invention, a method of fabricating a semiconductor device is provided, comprising the steps of: forming switching transistors on a semiconductor substrate; forming on said semiconductor substrate an insulating film to cover said switching transistors; forming contact holes in said insulating film, said contact holes reaching active regions of said switching transistors; forming on said insulating film a first conductive film which contacts said active regions of said switching transistors through said contact holes; forming on said first conductive film a multi-layer film comprising two or more kinds of insulating layers; performing first etching on prescribed portions of said multi-layer film until the surface of said first conductive film is exposed; performing second etching on the sides of said multi-layer film to form irregularities thereon; forming a second conductive film covering the sides of said multi-layer film; and performing third etching to remove said multi-layer film; wherein the etching rate difference between any layer of said multi-layer film and the neighboring layers under said second etching condition is greater than the etching rate difference between said layer and said neighboring layers under said first etching condition.

In a preferred embodiment, said first and second conductive films are polycrystalline silicon films.

In a preferred embodiment, said insulating film has a multilayer structure which contains an etching stop layer as an intermediate layer having a characteristic of resisting etching during said third etching.

In a preferred embodiment, the step of forming said multi-layer film on said first conductive film comprises a step of successively depositing two or more insulating layers having different concentrations of impurity by using a CVD technique.

In a preferred embodiment, the step of forming said multi-layer film on said first conductive film comprises a step of successively depositing two or more insulating layers containing different kinds of impurities by using a CVD technique.

In a preferred embodiment, said first etching is an anisotropic dry etching end said second etching is an isotropic etching.

According to the invention, a method of fabricating a semiconductor device is provided, comprising the steps of: forming switching transistors on a semiconductor substrate; forming on the semiconductor substrate an insulating film to cover said switching transistors; forming on said insulating film a multi-layer film comprising two or more kinds of insulating layers; performing first etching to etch prescribed portions of said multi-layer film and said insulating film and thereby forming contact holes in said multi-layer film and said insulating film, reaching active regions of said switching transistors; performing second etching to etch the sides of said multi-layer film and said insulating film and thereby forming irregularities in the sides thereof; forming a conductive film to cover said sides of said multi-layer film; and performing third etching to remove said multi-layer film.

In a preferred embodiment, the step of forming said multi-layer film on said first conductive film comprises a step of successively depositing two or more insulating layers having different concentrations of impurity by using a CVD technique.

In a preferred embodiment, the step of forming said multi-layer film on the first silicon film comprises a step of successively depositing two or more insulating layers containing different kinds of impurities by using a CVD technique.

In a preferred embodiment, said first etching is an anisotropic dry etching and said second etching is an isotropic etching.

According to the invention, a method of fabricating a semiconductor device is provided, comprising the steps of: forming switching transistors on a semiconductor substrate; forming on said semiconductor substrate an insulating film to cover said switching transistors; forming contact holes in said insulating film and reaching active regions of said switching transistors; forming on said insulating film a multi-layer film in such a way that a portion thereof contacts said active regions of said switching transistor through said contact hole, said multi-layer film comprising silicon layers each having a different concentration of impurity at least from that in an adjacent silicon layer; performing first etching for patterning said multi-layer film; performing second etching to etch the sides of said multi-layer film and thereby forming irregularities in said sides thereof; performing heat treatment to diffuse the said impurity; forming a dielectric film covering said multi-layer film; and depositing a silicon film over said dielectric film.

In a preferred embodiment, the step of forming said multi-layer film on said insulating film comprises a step of successively depositing said silicon layers by using a CVD technique.

Thus, the invention described herein makes possible the objective of providing a method of fabricating a semiconductor device comprising storage nodes each having a relatively large surface area in a reduced number of processing steps and with a high yield.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

A first embodiment of the present invention is now described. According to this embodiment, the box structured memory cell can be formed in a fewer number of processing steps than are necessary in the prior art fabricating method.

Figure 1A:
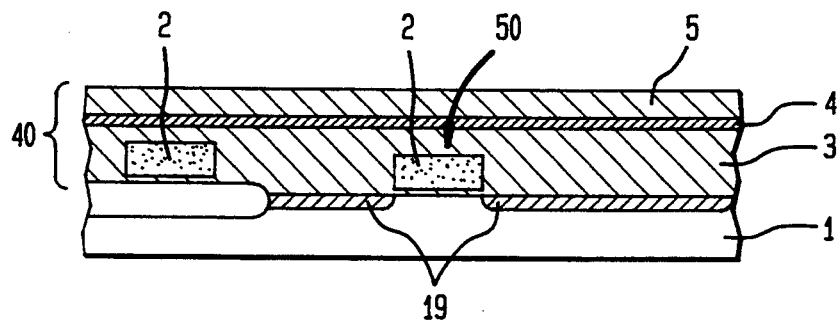
FIGS. 1A to 1H illustrate steps of fabricating a semiconductor device according to the first embodiment of the invention.
Figure 1B:
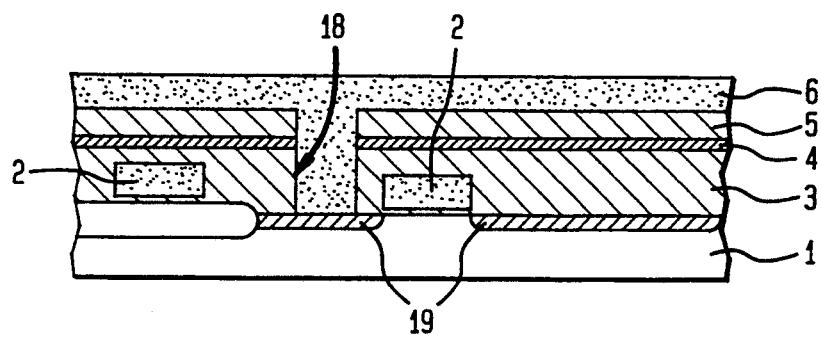

FIG. 1A shows in cross section a fragmentary portion of a partially fabricated semiconductor device. In this embodiment, switching transistors 50 are formed on a p-type silicon substrate 1, and an insulating film 40 is formed to cover the switching transistor 50.

The switching transistor 50, in this embodiment, is an n-type MOSFET having n-type impurity diffusion layers (function as the source/drain) 19 in the substrate 1 and the word line 2. The word line 2 functions as the gate electrode of the switching transistor 50. The insulating film 40, in this embodiment, has a multi-layer structure in which a first silicon oxide layer (500 nm thickness) 3, a silicon nitride layer (20 nm thickness) 4, and a second silicon oxide layer (100 nm thickness) 5 are laminated in this order starting from the side of the substrate 1. These layers are deposited by a CVD technique.

After a contact hole 18 for connecting the switching transistor 50 to a storage capacitor is formed in the insulating film 40 by photolithography and etching, a first silicon layer (100 nm thickness) 6 is formed as a conductive film on top of the second silicon oxide layer 5.

To enhance the conductivity of the first silicon layer 6, an n-type dopant is introduced into the first silicon layer 6. In this embodiment, the n-type dopant is mixed in a deposition gas when depositing the first silicon layer 6 by a CVD technique, so that the n-type dopant is introduced into the first silicon layer 6 during the growth thereof. Instead of using the above described method of introducing the dopant, a method may be used in which an n-type dopant is introduced into the first silicon layer 6 using ion implantation after the first silicon layer 6 containing no dopants has been deposited.

In this embodiment, all silicon layers formed as conductive films are structured in a polycrystalline form. In this specification, therefore, the term "silicon layer" means "polysilicon film". However, in application of the present invention, the crystal structure of the silicon layers is not limited to the polycrystalline form, but they may take the form of single crystal. Also, whale silicon layers are preferable as the conductive films, the use does not necessarily have to be limited to the silicon layers, but layers formed from a refractory metal or refractory metal silicide may be used.

Using a CVD technique, a first nondoped silicon oxide (NSG: Nondoped Silicate Glass) layer 7, a $P_2O_5$-doped silicon oxide (PSG: Phospho-Silicate Glass) layer 8, and a second NSG layer 9 are deposited in this order on top of the first silicon layer 6, to form a multi-layer film 80. The first NSG layer 7, the PSG layer 8, and the NSG layer 9 each have a thickness of 200 nm, which constitute the multi-layer film 80 of 600 nm thickness on top of the first silicon layer 6. Thereafter, the substrate 1 is annealed for 20 minutes at 900° C.

Figure 1C:
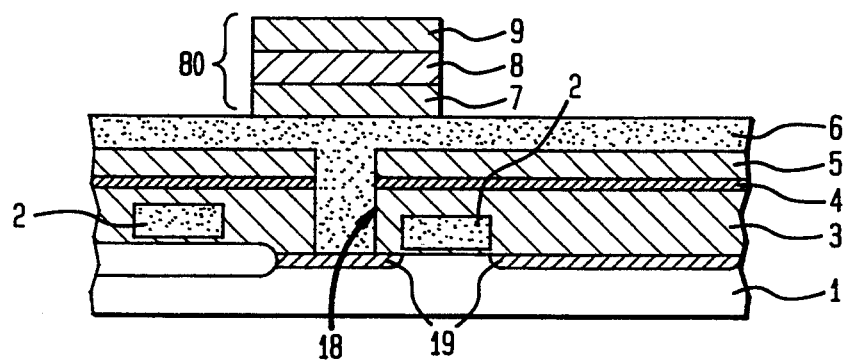

After forming an etching mask (not shown) having a prescribed pattern by photolithography on the second NSG layer 9, anisotropic dry etching is performed to pattern the multi-layer film 80 from the pattern of the etching mask (FIG. 1C). Since the layers constituting the multi-layer film 80 are all formed from silicon oxide, the etching conditions do not have to be changed from layer to layer, but all layers can be etched continuously.

To describe the above etching process in detail, a photoresist is used as the etching mask, while in the anisotropic dry etching process, a chloro-fluorocarbon gas is used as the etching gas to perform the etching under a reactive ion etching condition. Under the etching condition, no substantial differences are noted in the etching rate between the first NSG layer 7, the PSG layer 8, and the second NSG layer 9. In particular, since the etching is performed under a highly anisotropic etching condition, the etching in directions parallel with the main surface of the substrate 1 (lateral directions) is achieved at an etching rate of nearly zero on each layer regardless of the kind of the layer. As a result, the sides of the multi-layer film 80 are etched flat, with no substantial irregularities formed thereon.

Next, using a solution containing $NH_4F$ and HF in a ratio of 20:1, etching of the multi-layer film 80 is performed for 2 minutes. With this etching condition, a great difference is noted in the etching rate between the first NSG layer 7, the PSG layer 8, and the second NSG layer 9. To describe specifically, the etching rate of the PSG layer 8 is greater than the etching rate of the first and second NSG layers 7 and 9. This is because the PSG layer 8 has a high concentration of impurity ($P_2O_5$) and is therefore easier to be etched than the nondoped NSG layers 7 and 9.

Figure 1D:
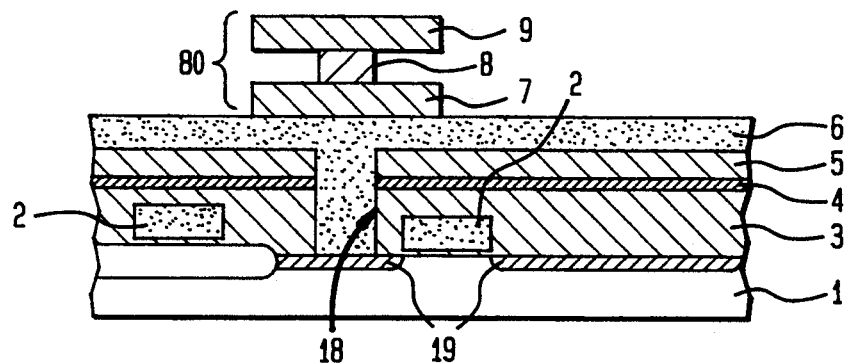

The etching rate difference between any layer of the multi-layer film 80 and the neighboring layers under the above etching condition is greater than the etching rate difference between the layer and the neighboring layers under the anisotropic etching condition. Therefore, after the above etching process, as shown in FIG. 1D, substantially large irregularities are formed on the sides of the multi-layer film 80 in proportion to the difference in etching rate.

Figures 8, 9:
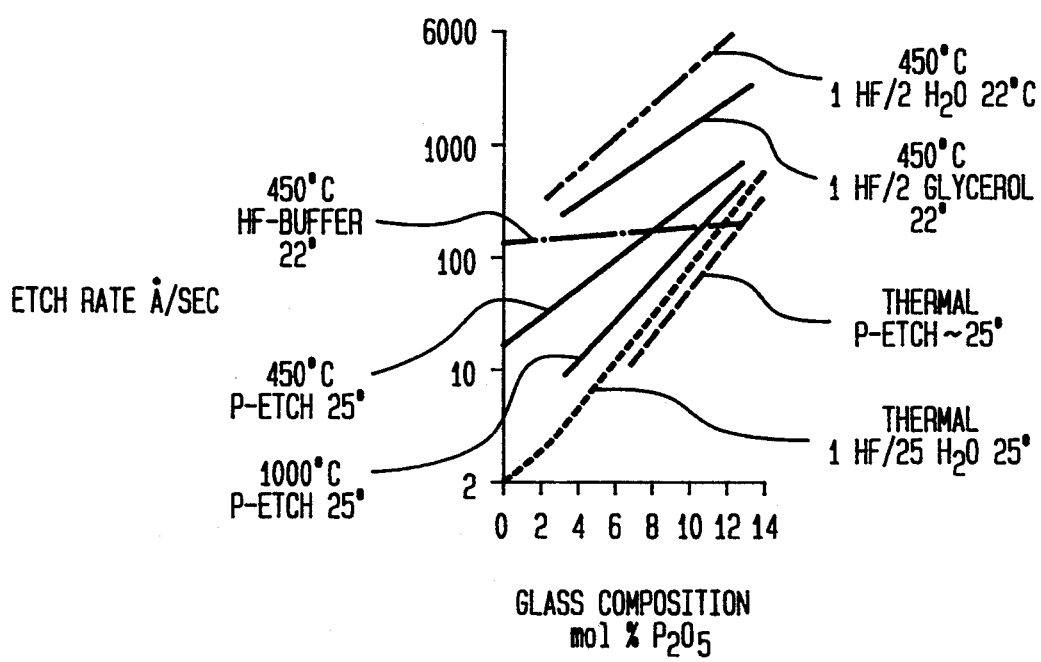
FIG. 8 shows the etching rate of each of the NSG, PSG, BPSG, and thermal $SiO_2$ layers.
FIG. 9 shows a relationship between the etching rate of the PSG layer and the concentration of impurity ($P_2O_5$) in the PSG layer.
Figure 10A:
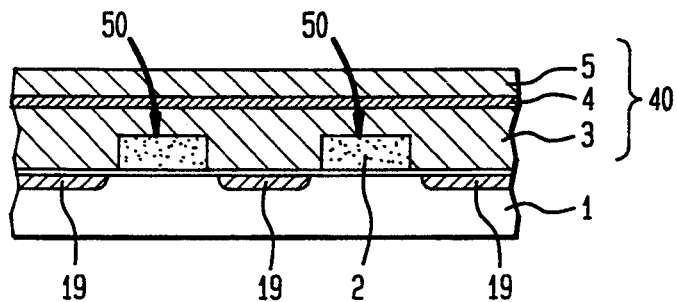
FIGS. 10A to 10G illustrate steps of fabricating a semiconductor device according to a prior art.
Figure 10B:
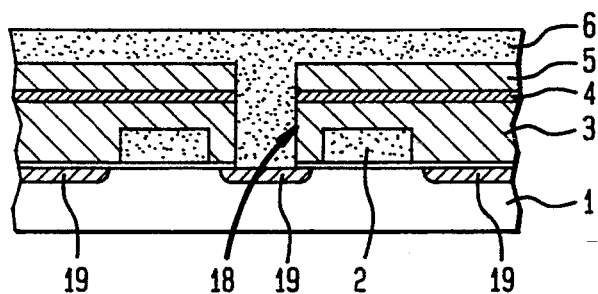
Figure 10C:
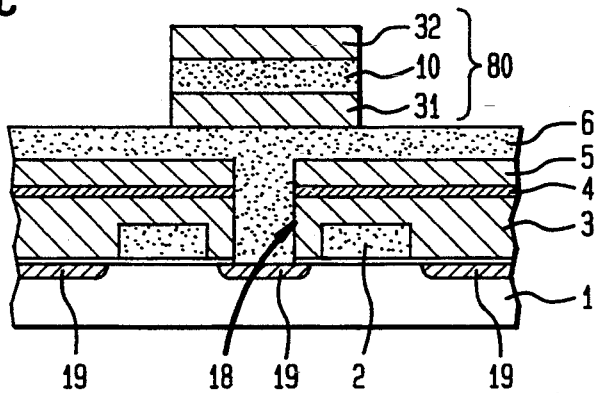
Figure 10D:
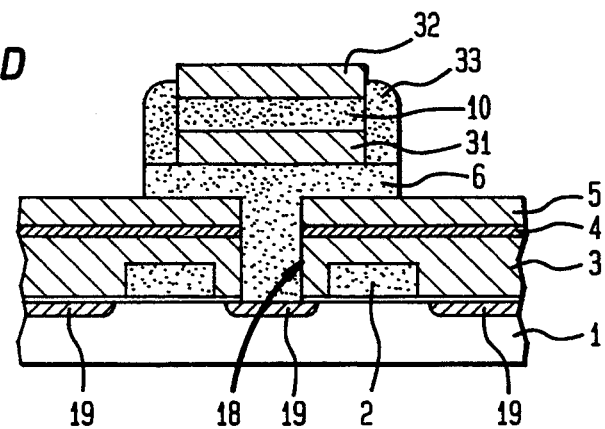
Figure 10E:
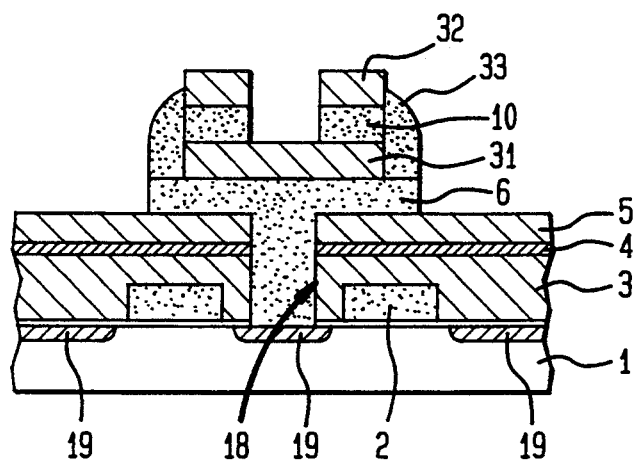
Figure 10F:
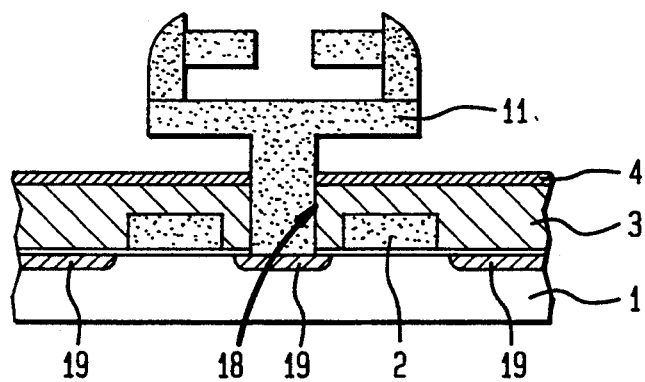
Figure 10G:
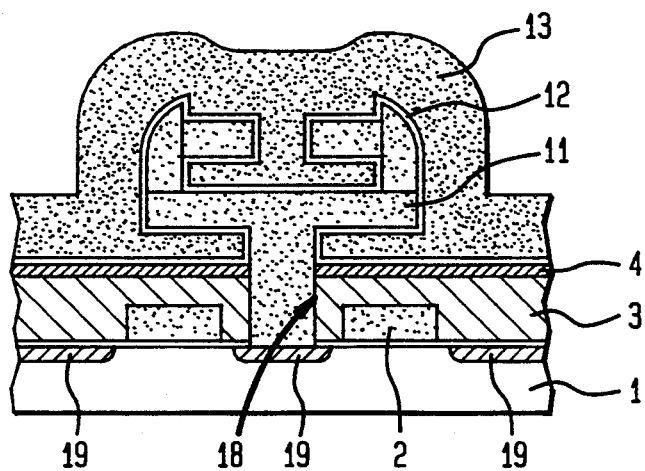
Figure 11A:
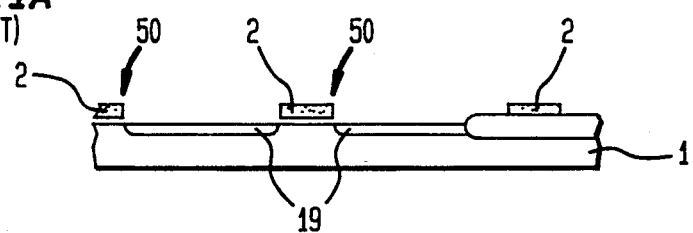
FIGS. 11A to 11G illustrate steps of fabricating a semiconductor device according to another prior art.
Figure 11B:
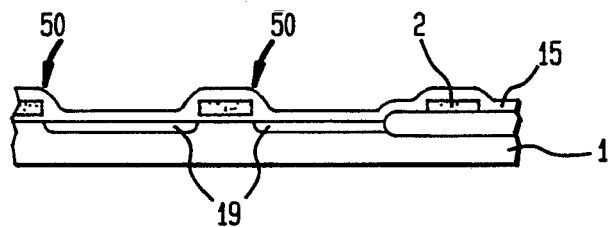
Figure 11C:
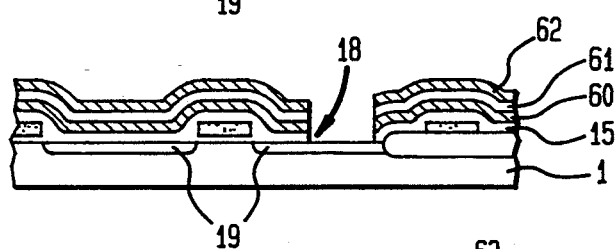
Figure 11D:
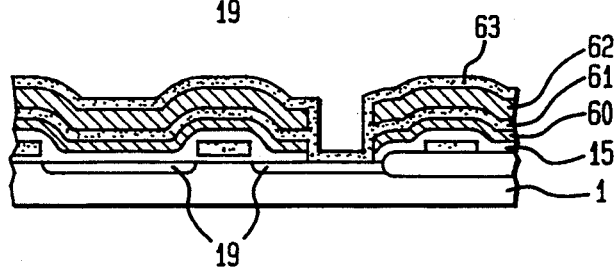
Figure 11E:
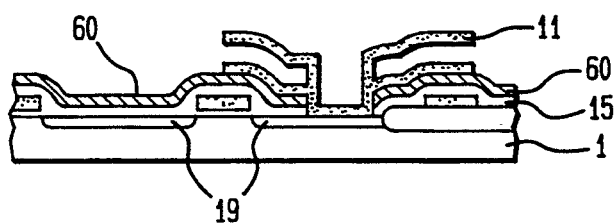
Figure 11F:
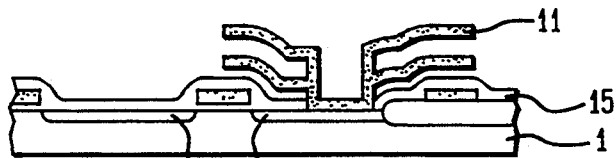
Figure 11G:
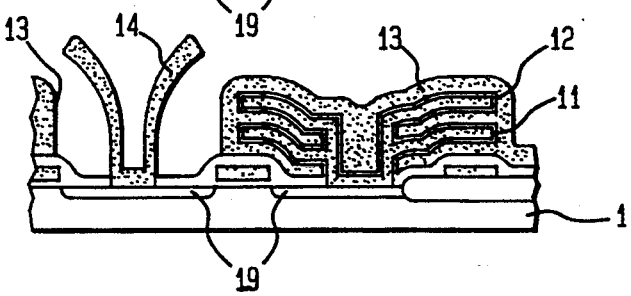

FIG. 9 shows the relationship between the etching rate of the PSG layer and the concentration of impurity ($P_2O_5$) in the PSG layer (J. M. Eldridge and P. Balk, Trans. Metalurg. Sec. AITM, 242: 539, 1968). As is apparent from FIG. 9, the etching rate is greatly dependent on the concentration of impurity and the etchant used.

FIG. 8 shows the results of the experiment carried out by the inventor to obtain the etching rate of each of the NSG, PSG, BPSG (Boro-Phospho-Silicate Glass), and thermal silicon oxide ($SiO_2$) layers. The concentration of $P_2O_5$ in the PSG layer used in the experiment was 8.5 mol %. Also, the concentrations of $B_2O_3$ and $P_2O_5$ in the BPSG layer were 11.0 mol % and 6.6 mol %, respectively.

In FIG. 8, "as-depo" indicates the condition not treated with annealing after deposition, and "annealed" indicates the condition treated with 20 minutes annealing at 900° C. after deposition. The etching was performed using a solution in which $NH_4F$ and HF were mimed in a ratio of 20:1. As shown in FIG. 8, PSG (as-depo) has an etching rate about six times as great as that of BPSG (as-depo), while PSG (annealed) has an etching rate about four times as great as that of NSG (annealed). This shows that even in the case of layers formed from the silicon oxide the etching rates vary greatly depending on the etching conditions if the impurity concentrations are different.

It is also apparent that the etching rate is dependent on the kind of the impurity added. Therefore, instead of varying the concentration of impurity in each layer, the kind of the impurity added thereto may be varied in order to change the etching rate in the wet etching or chemical etching of each of the layers constituting the multi-layer film 80.

Generally, the etching rate in wet etching has greater dependence on the concentration and kind of the impurity in the layer than does the etching rate in drying etching. Therefore, wet etching is suitable as the etching process for forming irregularities in the sides of the multi-layer film 80. However, under the conditions in which isotropic chemical etching is achieved, it is also possible to form irregularities in the sides of the multi-layer film 80 by drying etching.

After the above etching process, a second silicon layer (150 nm thickness) 10 containing an n-type dopant is deposited over the first silicon layer 6 in such a manner as to completely cover the multi-layer film 80. The deposition is made by a CVD technique. The second silicon layer 10, along with a portion of the first silicon layer 6, is used to form a portion of the storage node 11 of the storage capacitor (see FIG. 1G). The storage node 11 needs to be connected to the n-type impurity diffusion layers 19 with a low electrical resistance. This requires caution so that even the slightest insulating layer will not be formed at the interface between the first silicon layer 6 and the second silicon layer 10.

Generally, exposed portions at the surface of the first silicon layer 6 are oxidized during the process for forming the second silicon layer 6 by a CVD technique. This oxidation takes place when or immediately after the substrate 1 is inserted in a CVD reactor maintained at a temperature of about 600° C. causing the heated surface of the first silicon layer 6 to react with oxygen or vapor in the atmosphere. In this embodiment, to prevent the oxidation from occurring, the substrate 1 is inserted in the CVD reactor after the temperature of the CVD reactor has been temporarily lowered to about 450° C. At this temperature, hardly any oxidation is caused on the surface of the first silicon layer 6.

Figure 1E:
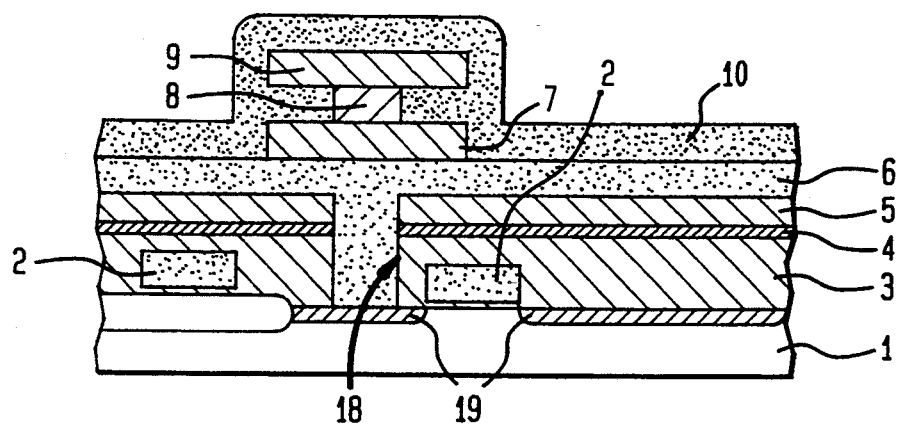
Figure 1F:
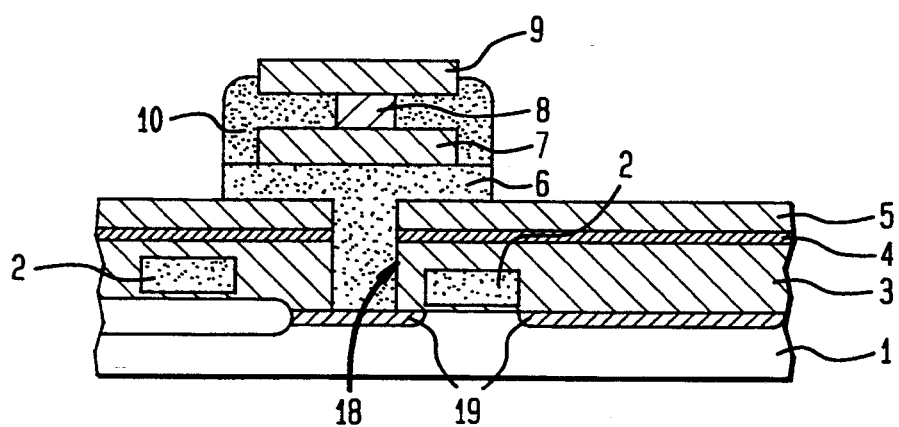

Next, by anisotropic etching process, the second silicon layer 10 is etched back. The etchback is continued until the surfaces of the second NSG layer 9 and second silicon oxide layer 5 are exposed, thus forming the structure shown in FIG. 1F. This anisotropic etching process is similar to the etching process for forming side spacers on the sides of the gate electrode of a MOSFET. As a result of the above etchback process, the second silicon layer 10 is left only on the sides of the multi-layer film 80, exposing the top portion (second NSG layer 9) thereof.

Figure 1G:
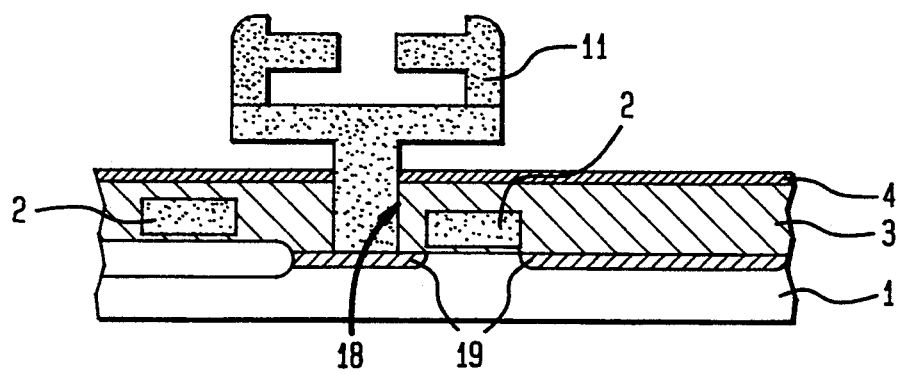

Next, using a hydrogen fluoride solution, the second NSG layer 9, the PSG layer 8, the first NSG layer 7, and the second silicon oxide layer 5 are etched away, thus removing the multi-layer film 80 from inside the storage node 11 (FIG. 1G). Since the above-mentioned hydrogen fluoride solution hardly works to etch silicon nitride, the silicon nitride layer 4 functions as an etching stopper to prevent the first silicon oxide layer 3 from being etched. In the case of not forming the silicon nitride layer 4, the etching time must be carefully controlled so that the insulating film 40 will not be etched excessively.

Figure 1H:
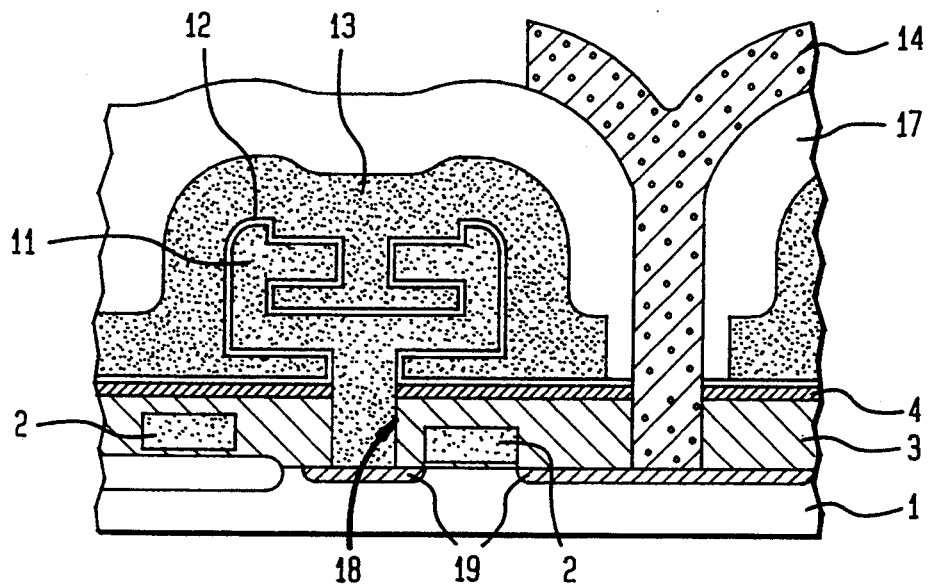

Next, a dielectric film 12 and a cell plate 13 are successively formed in such a manner as to cover the storage node 11, thus forming a storage capacitor. Thereafter, an insulating film 17 is formed to cover the storage capacitor, and a contact hole is formed in a prescribed portion of the insulating film 17, after which there is formed a bit line 14 to be connected to the n-type impurity diffusion 19 of the switching transistor 50. Thus, the one transistor and one capacitor memory cell is formed having a box-like structure as shown in FIG. 1H.

According to the method of this embodiment, the horizontal size of the storage node 11 can be controlled with high accuracy by varying the thickness of the second silicon layer 10. The accuracy achieved is higher than the resolution of photolithography.

In this embodiment, wet etching is performed to form irregularities on the sides of the patterned multi-layer film 80 after annealing the multi-layer film 80, but the wet etching may be performed before the annealing. In that case, since fine irregularities are formed in large numbers on the sides of the PSG layer 8, the surface area of the storage node 11 is further increased. These irregularities are more likely to be caused on BPSG layers than on PSG layers.

Figure 2:
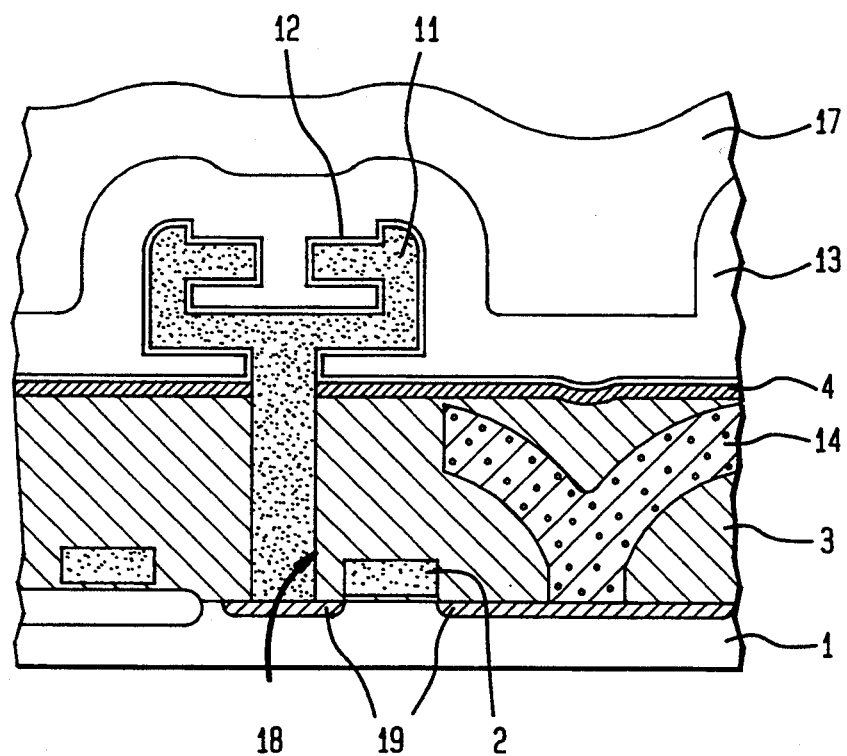
FIG. 2 is a partial sectional view of a semiconductor device fabricated according to the modification of the first embodiment.

In the first embodiment, the process for forming the bit line 14 is performed after the process for forming the storage node 11. However, the sequence of these processes may be reversed. By performing the process for forming the storage node 11 after the process for forming the bit line 14, a memory cell having a structure as shown in FIG. 2 is formed.

Figure 3A:
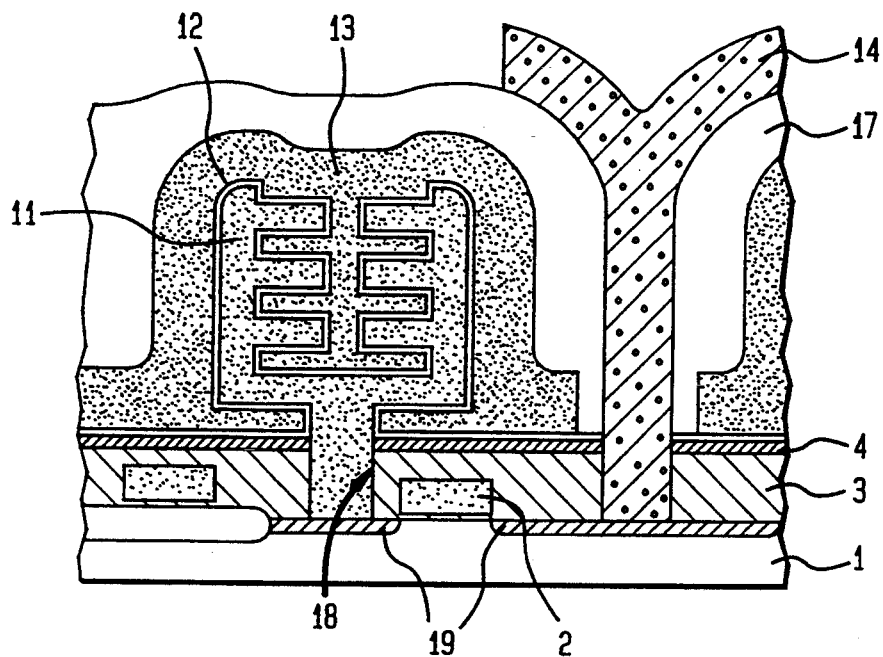
FIG. 3A is a partial sectional view of a semiconductor device fabricated according to the second embodiment of the invention.
Figure 3B:
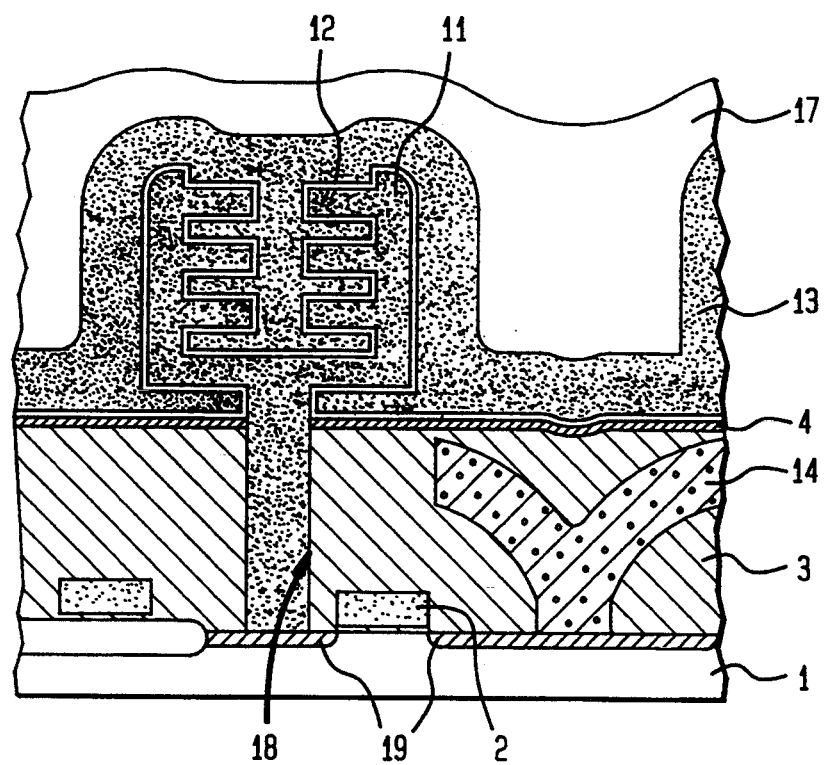
FIG. 3B is a partial sectional view of a semiconductor device fabricated according to the modification of the second embodiment.

In the first embodiment, the multi-layer film 80, a film comprising three layers, is formed on top of the first silicon layer 6 by depositing thereon the first NSG layer 7, the PSG layer 8, and the second NSG layer 9 in this order starting from the side of the substrate 1. However, the multi-layer film 80 does not have to be limited to a film comprising three layers. The multi-layer film 80 may be formed, for example, in seven layers comprising an NSG layer, a PSG layer, an NSG layer, a PSG layer, an NSG layer, a PSG layer, and an NSG layer deposited in this order, one on top of the other, starting from the side of the substrate 1. FIG. 3A shows schematically a cross section of a memory cell fabricated according to the second embodiment of the invention including the step of forming the seven-layer film. As shown in FIG. 3A, the storage node 11 comprises a plularity of fins (projections) extending inwardly. FIG. 3B shows a view of the memory cell corresponding to that of FIG. 2.

As the number of layers forming the multi-layer film 80 increases, the surface area of the storage node 11 increases, and consequently, the amount of electric charge that can be stored in one storage capacitor increases. Thus, according to the present invention, the number of projections inside the storage node 11 can be increased just by increasing the number of layers forming the multi-layer film 80.

In the first and second embodiments, the number of layers forming the multi-layer film 80 is increased by repeating the process for forming an NSG layer end the process for forming a PSG layer during the formation of the multi-layer film 80. However, it is also possible to combine these processes into a single process. Formation of an NSG layer and a PSG layer can be performed successively by sequentially changing the composition of deposition gas to be fed into the CVD reactor. To describe specifically, when a deposition gas comprising SiH4, O2, and PH3 is used as the gas to be fed into the CVD reactor, feeding of PH3 into the CVD reactor is interrupted periodically, whereby an NSG layer not containing P2O5 and a PSG layer containing P2O5 are formed alternately in a single process.

Figure 5:
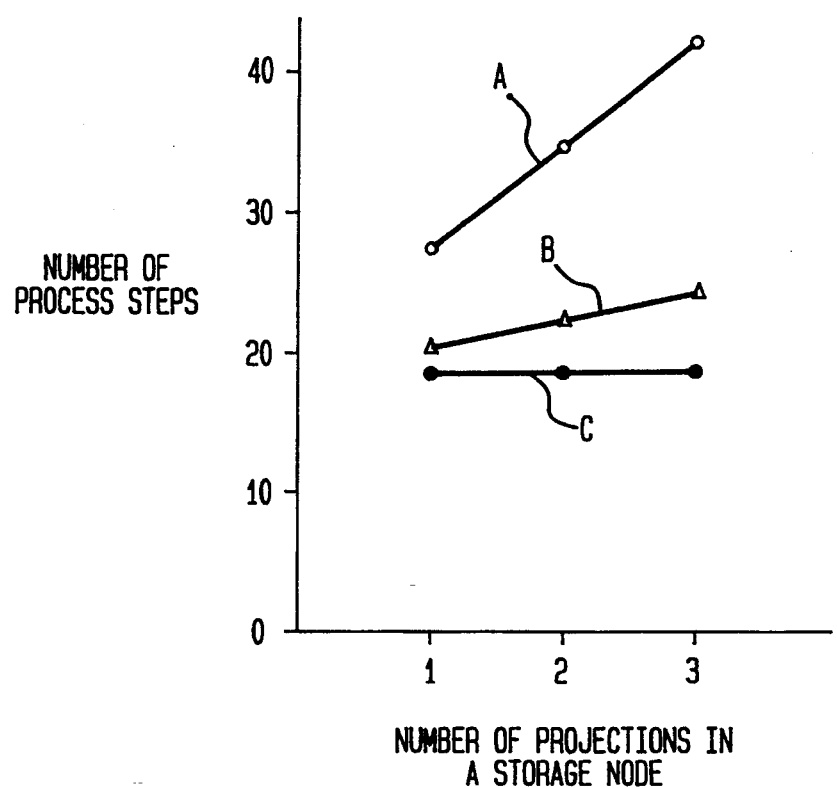
FIG. 5 shows the relationship between the number of projections inside the storage node and the number of steps required to form the storage node having as many numbers of the projections.

FIG. 5 shows the relationship between the number of projections inside the storage node 11 and the number of processes required to form the storage node 11 having as many numbers of projections. The number of processes means how many processes are required after the contact hole 18 is formed for connecting the storage node 11 to the switching transistor 50, until the formation of the storage node 11 is completed.

In FIG. 5, the line indicated by A shows the above relationship in the case of the prior art. The line indicated by B shows the above relationship in the case of the first embodiment of the present invention, while the line C shows the relationship in the case of the first embodiment when deposition of the multi-layer film 80 is performed in a single process. It can be seen from FIG. 5 that as the number of projections inside the storage node 11 is increased, the number of processes for forming the storage node 11 increases in the prior art method, but does not increase or only slightly increases according to the embodiments of the present invention.

In either of the above embodiments, the multi-layer film 80 is composed of silicon oxide layers stacked one on top of the other. These layers are formed from the same main components, although the concentration and kind of the impurity added are different from each other. Therefore, it is easy to etch the multi-layer film 80 in a single step using the same dry etching conditions with no substantial differences caused in the etching rate between the layers.

In the case of a multi-layer film 80 comprising layers of different materials, for example, silicon oxide layers and silicon layers, it is difficult to pattern the multi-layer film 80 in a single process using highly anisotropic etching condition like the above case, but it involves an increase in the number of processing steps. According to the present invention, in contrast, since the concentration or kind of impurity in each of the layers forming the multi-layer film 80 is changed without changing the materials of the layers, the multi-layer film 80 can be easily patterned, and furthermore, irregularities can be formed on the sides of the patterned multi-layer film 80 by anisotropic etching.

Figure 4A:
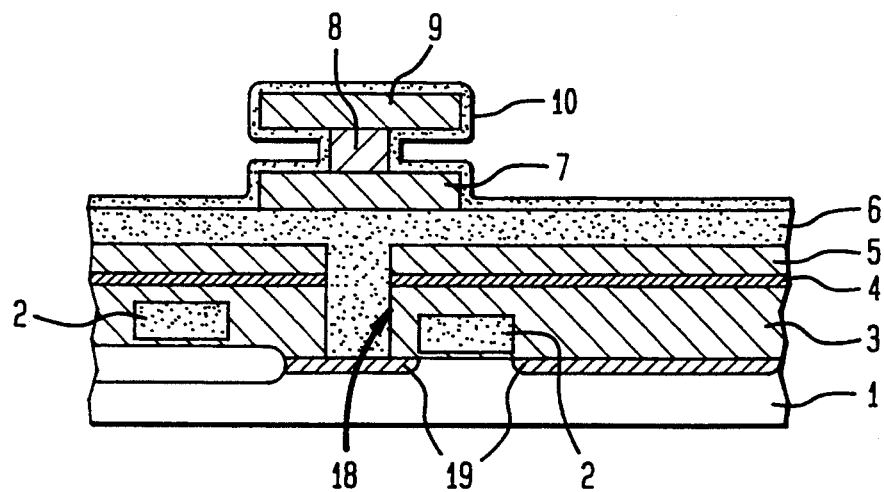
FIG. 4A is a partial sectional view of a semiconductor device at a stage of the process according to the third embodiment of the invention.
Figure 4B:
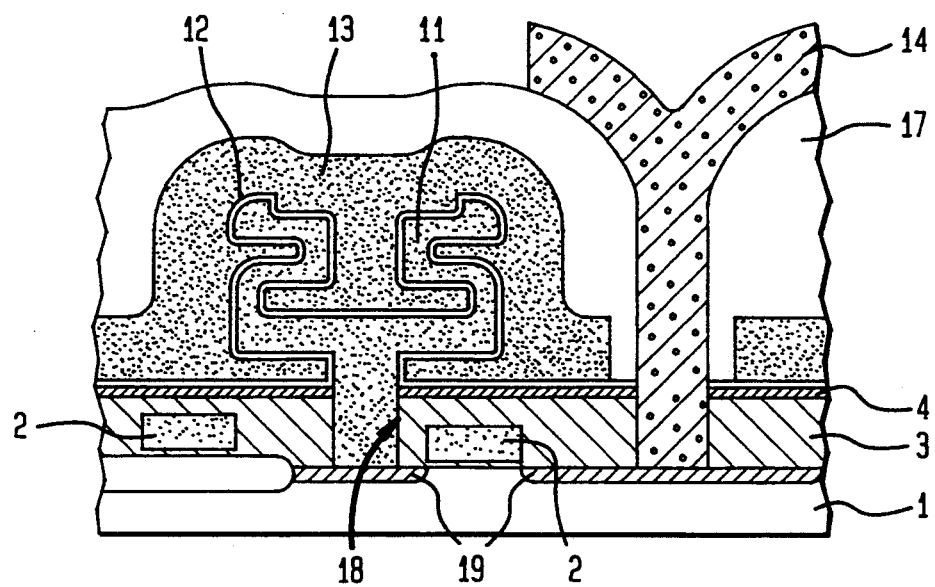
FIG. 4B is a partial sectional view of the semiconductor device fabricated according to the third embodiment.

A third embodiment of the invention is now described. FIG. 4A shows schematically a cross section of a portion of a silicon substrate 1 at a stage of the fabricating method of this embodiment. This Figure shows a view corresponding to that of FIG. 1E used to explain the first embodiment. This embodiment differs from the first embodiment in that the thickness of the second silicon layer 10 is less than half that of the PSG layer 8, the other processing steps being the same between the two embodiments. With the thickness of the second silicon layer 10 reduced to less than half that of the PSG layer 8, the surface area of the second silicon layer 10 is increased as compared with that of the first embodiment. FIG. 4B shows a memory cell formed by the method of this embodiment. As sown in FIG. 4B, the storage node 11 comprises the bellows-like portion.

Figure 6A:
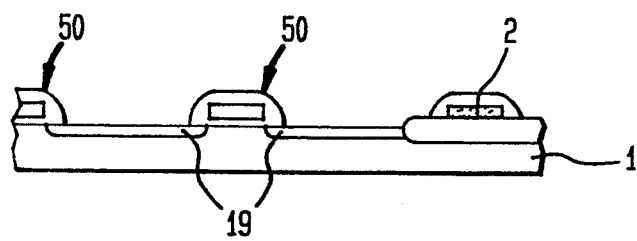
FIGS. 6A to 6F illustrate steps of fabricating a semiconductor device according to the fourth embodiment of the invention.

A fourth embodiment of the invention is now described. FIG. 6A shows in cross section a fragmentary portion of a partially fabricated semiconductor device. In this embodiment also, a switching transistor 50 is formed on a p-type silicon substrate 1. The switching transistor 50 includes n-type impurity diffusion layers 19 and a word lines 2 that also serve as the gate electrode.

Figure 6B:
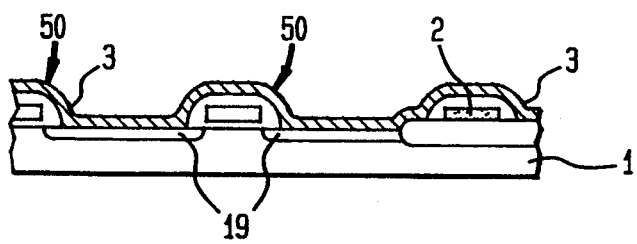

As shown in FIG. 6B, after depositing an insulating film 3 by a CVD technique on the substrate 1 in such a manner as to cover the switching transistor 50, a first PSG layer 20, a first NSG layer 21, a second PSG layer 22, and a second NSG layer 23 are successively deposited in this order on the insulating film 3 starting from the side of the substrate 1, thus forming a multi-layer film 80. This successive deposition is accomplished by sequentially changing the composition of the deposition gas fed into a CVD reactor after the substrate 1 has been inserted into the CVD reactor. To describe specifically, a deposition gas composed of SiH$_4$ (flow rate: 40 sccm), O$_2$ (flow rate: 500 sccm), and PH$_3$ (flow rate: 5 sccm) is first introduced into the CVD reactor maintained at a temperature of 400° C., to deposit the first PSG layer 20 on top of the insulating film 3. Thereafter, by interrupting the feeding of PH$_3$ into the CVD reactor, the first NSG layer 21 is formed which does not contain P. By repeating the above steps, the second PSG layer 22 and the second NSG layer 23 are successively deposited.

Figure 6C:
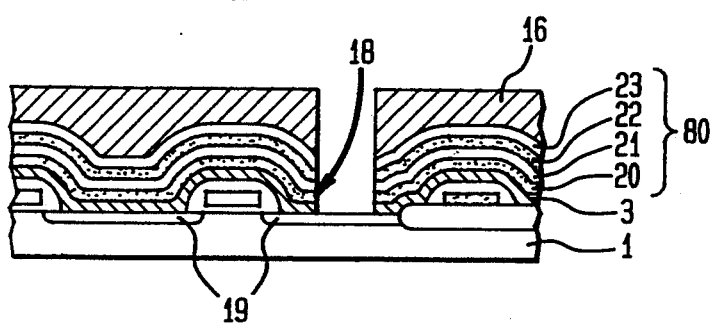

A photoresist mask 16 having a pattern for defining contact holes is formed by photolithography over the multi-layer film 80, which is followed by an etching process. In the etching process, highly anisotropic dry etching is performed using the technique of reactive ion etching, thereby forming a contact hole 18 in the multi-layer film 80, reaching down to the n-type impurity diffusion layer 19 of the switching transistor 50, as shown in FIG. 6C. With the above etching condition, no substantial differences are noted in the etching rates between the insulating film 3, the first PSG layer 20, the first NSG layer 21, the second PSG layer 22, and the second NSG layer 23. In particular, since the etching is performed with a high degree of anisotropy, the etching rate in directions parallel to the main surface of the substrate 1 (lateral directions) is nearly zero for each layer regardless of the kind of the layer. As a result, the sides of the multi-layer film 80 are etched flat, as shown in FIG. 6C, with no substantial irregularities formed thereon.

Next, using a solution containing HF and H$_2$O in a ratio of 1:50, etching of the multi-layer film 80 is performed for 60 seconds. With this etching condition, a great difference is noted between the etching rate of the NSG layers 21 and 23 and that of the PSG layers 20 and 22. To describe specifically, the etching rate of the PSG layers 20 and 22 is greater than that of the NSG layers 21 and 23.

Figure 6D:
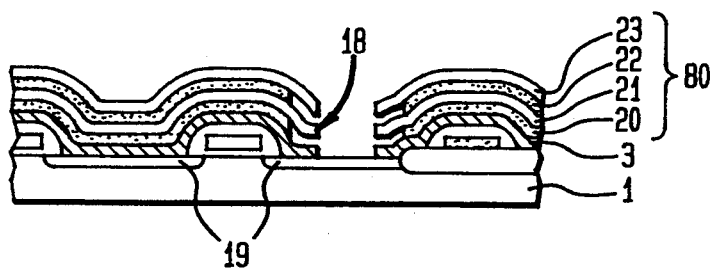
Figure 6E:
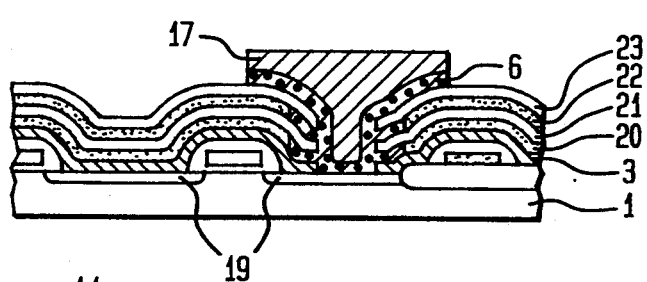

After the above etching process, substantially large irregularities are formed, as shown in FIG. 6D, on the sides of the multi-layer film 80, i.e., on the wall of the contact hole 18, in proportion to the difference in etching rate. Thereafter, a first silicon layer (100 nm thickness) 6, which serves as a conductive film, is formed on the multi-layer film 80 in such a manner as to bury the contact hole 18. After a photoresist mask 17 is formed on the first silicon layer 6, the first silicon layer 6 is then etched to form a storage node 11 as shown in FIG. 6E (see FIG. 6F). After removing the multi-layer film 80 by wet etching, the photoresist mask 17 is removed.

Figure 6F:
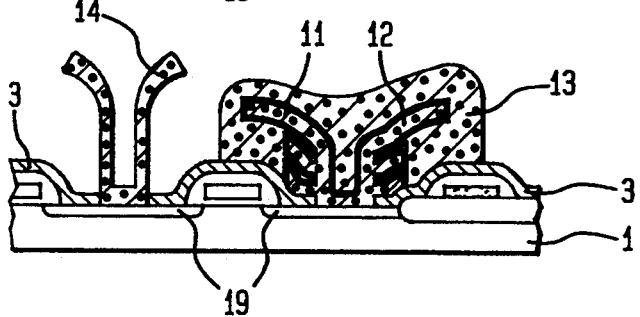

Next, a-dielectric film 12 and a cell plate 13 are formed in this order on the storage node 11, to form a storage capacitor shown in FIG. 6F. Thereafter, the same process as in the first embodiment is performed to form a memory cell.

Figure 7A:
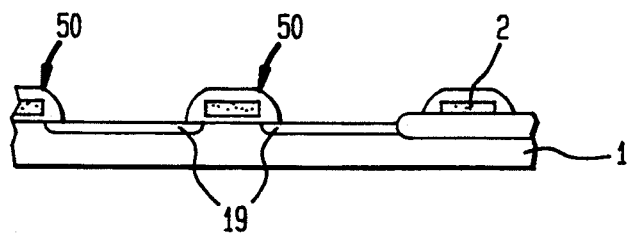
FIGS. 7A to 7F illustrate steps of fabricating a semiconductor device according to the fifth embodiment of the invention.

A fifth embodiment of the invention is now described. According to this embodiment, a fin structured memory cell can be formed in a fewer number of processing steps than are necessary in the prior art fabricating method. FIG. 7A shows in cross section a fragmentary portion of a p-type silicon substrate 1 on which switching transistors 50 are formed. The switching transistor 50 is an n-type MOSFET having n-type impurity diffusion layers 19 and a word line 2 that also serves as the gate electrode.

Figure 7B:
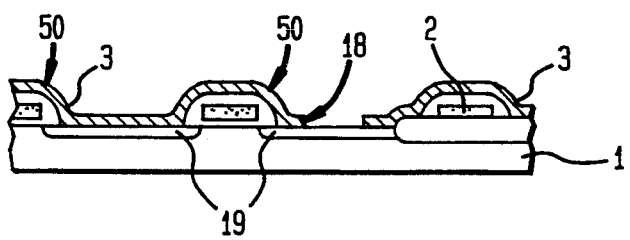
Figure 7C:
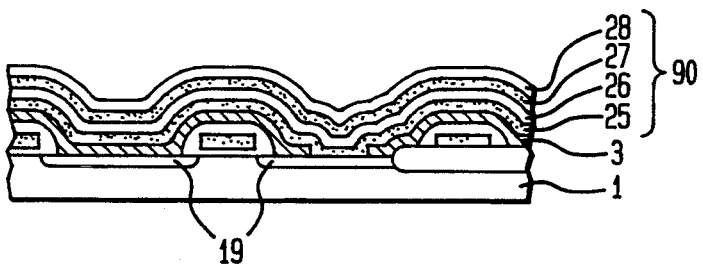

After an insulating film 3 has been deposited by a CVD technique over the substrate 1 in such a manner as to cover the switching transistor 50, a contact hole 18 was formed in the insulating film 3 as shown in FIG. 7B. Then, a first silicon layer 25, a second silicon layer 26, a third silicon layer 27, and a fourth silicon layer 28 are successively deposited in this order on top of the insulating film 3 starting from the side of the substrate 1, to form a multi-layer film 90 as shown in FIG. 7C. This successive deposition is accomplished by sequentially changing the composition of the deposition gas fed into a CVD reactor after the substrate 1 has been inserted into the CVD reactor. To describe specifically, a deposition gas composed of SiH$_4$ (flow rate: 500 sccm) and PH$_3$ (flow rate: 1.2 sccm) is first introduced into the CVD reactor maintained at a temperature of 625° C., and by applying a pressure of 120 Pa the first PSG layer 25 doped with P is deposited on top of the insulating film 3. Thereafter, by interrupting the feeding of PH$_3$ into the CVD reactor and reducing the pressure to 50 Pa, the second NSG layer 26 is formed which does not contain P. By repeating the above steps, the third silicon layer 27 and the fourth silicon layer 28 are successively deposited.

Figure 7D:
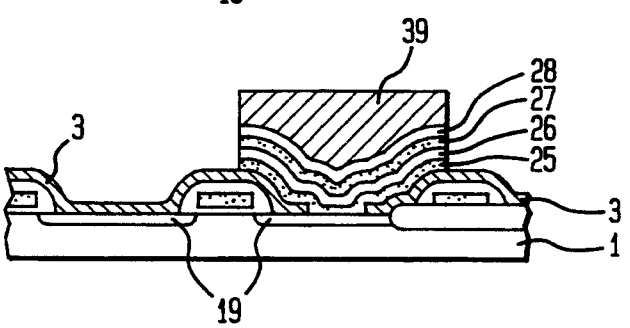

A photoresist mask 39 having a prescribed pattern is formed by photolithography on the multi-layer film 90, which is followed by an etching process. In the etching process, highly anisotropic dry etching is performed using the technique-of reactive ion etching until the insulating film 3 is exposed, thereby patterning the multi-layer film 90 in the form as shown in FIG. 7D. With the above etching conditions, no substantial differences are noted in the etching rates between the first silicon layer 25, the second silicon layer 26, the third silicon layer 27, and the fourth silicon layer 28. In particular, since the etching is performed with a high degree of anisotropy, the etching rate in directions parallel to the main surface of the substrate 1 (lateral directions) is nearly zero for each layer regardless of the concentration of impurity in the layer. As a result, the sides of the multi-layer film 90 are etched flat, as shown in FIG. 7D, with no substantial irregularities formed thereon.

Figure 7E:
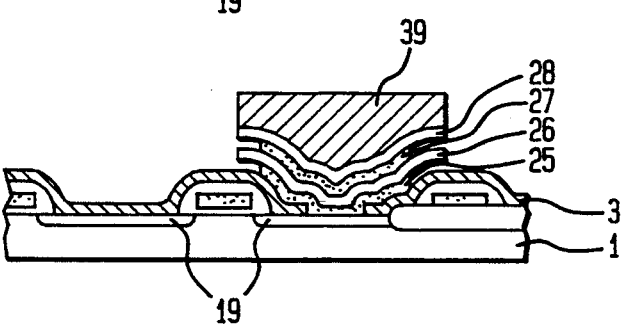

Next, using a solution containing HF and HNO$_3$ in a ratio of 1:400, etching of the multi-layer film 90 is performed for 30 seconds. With this etching condition, a great difference is noted between the etching rate of the second and fourth silicon layers, neither containing impurity (P), and that of the first and third silicon layers. To describe specifically, the etching rate of the first and third silicon layers containing P is greater than that of the second and fourth silicon layers not containing P. After the above etching process, substantially large irregularities are formed, as shown in FIG. 7E, on the sides of the multi-layer film 90 in proportion to the difference in etching rate.

In the above etching process, wet etching is used, but it is also possible to form irregularities in the sides of the multi-layer film 90 by dry etching. To describe specifically, isotropic etching using a plasma, a mixture gas of CF$_4$ and O$_2$, can also be used to form irregularities in the sides of the multi-layer film 90. Also, instead of P, As may be used as the impurity added to the silicon layers.

Figure 7F:
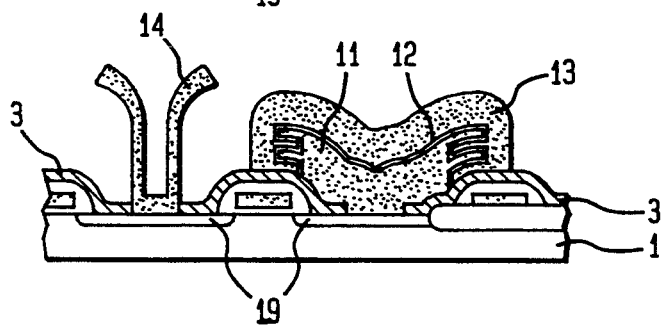

After the above etching process, P is uniformly diffused into the multi-layer film 90 by annealing, to form a storage node 11. Next, a dielectric film 12 and a cell plate 13 are formed in this order on the storage node 11, thus forming a storage capacitor shown in FIG. 7F. Thereafter, The same process as in the first embodiment is performed to form a memory cell. In FIG. 7F, an insulating layer covering the storage capacitor is not shown for clarity, but a bit line 14 is shown.

In the above embodiment, the multi-layer film 90 comprises silicon layers not doped with impurity and silicon layers doped with impurity, but the structure of the multi-layer film 90 does not necessarily have to be limited to the one described above. For example, even when all silicon layers constituting the multi-layer film 90 are doped with impurity, if the concentration of the impurity differs between two adjacent layers, the same effects as in the above embodiment can be obtained.

It is understood that various other modification will be apparent to and can be readily made by those skilled in the art without departing from the scope and spirit of the invention. Accordingly, it is not intended the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of fabricating a semiconductor device, comprising the steps of:

forming switching transistors on a semiconductor substrate;

forming on the semiconductor substrate an insulating film to cover said switching transistors;

forming on said insulating film a multi-layer film consisting of two or more kinds of insulating layers;

performing first etching to form contact holes in said multi-layer film and said insulating film, said contact holes reaching active regions of said switching transistors;

performing second etching to etch the sides of said multi-layer film and said insulating film and thereby forming grooves in the sides thereof;

forming a conductive film to cover said sides of said multi-layer film and said insulating film; and performing third etching to remove said multi-layer film.

2. A method according to claim 1, wherein the step of forming said multi-layer film on said insulating film comprises a step of successively depositing two or more insulating layers having different concentrations of impurity by using a CVD technique.

3. A method according to claim 1, wherein the step of forming said multi-layer film on the insulating film comprises a step of successively depositing two or more insulating layers containing different kinds of impurities by using a CVD technique.

4. A method according to claim 2 or 3, wherein said first etching is an anisotropic dry etching and said second etching is an isotropic etching.

* * * * *